United States Patent
Chen et al.

(10) Patent No.: US 9,332,646 B2
(45) Date of Patent: May 3, 2016

(54) ELECTRONIC PACKAGE MODULE AND METHOD OF MANUFACTURING THE SAME

(71) Applicants: UNIVERSAL SCIENTIFIC INDUSTRIAL (SHANGHAI) CO., LTD., Shanghai (CN); UNIVERSAL GLOBAL SCIENTIFIC INDUSTRIAL CO., LTD., Nantou County (TW)

(72) Inventors: Jen-Chun Chen, New Taipei (TW); Hsin-Chin Chang, Taipei (TW)

(73) Assignees: Universal Scientific Industrial (Shanghai) Co., Ltd., Shanghai (CN); Universal Global Scientific Industrial Co., Ltd., Nantou County (TW)

( * ) Notice: Subject to any disclaimer, the term of this patent is extended or adjusted under 35 U.S.C. 154(b) by 306 days.

(21) Appl. No.: 13/745,766

(22) Filed: Jan. 19, 2013

(65) Prior Publication Data

US 2014/0126161 A1    May 8, 2014

(30) Foreign Application Priority Data

Nov. 2, 2012 (TW) .............................. 101140726 A

(51) Int. Cl.
- *H05K 1/18* (2006.01)
- *H05K 3/30* (2006.01)
- *H01L 23/552* (2006.01)
- *H01L 25/16* (2006.01)
- *H05K 3/28* (2006.01)
- *H01L 23/31* (2006.01)

(52) U.S. Cl.
CPC ............. *H05K 1/186* (2013.01); *H01L 23/552* (2013.01); *H01L 25/16* (2013.01); *H05K 3/284* (2013.01); *H05K 3/30* (2013.01); *H01L 23/3135* (2013.01); *H01L 2924/0002* (2013.01); *H01L 2924/1531* (2013.01); *H05K 2201/1056* (2013.01); *H05K 2203/1316* (2013.01); *H05K 2203/1327* (2013.01); *Y10T 29/4913* (2015.01)

(58) Field of Classification Search
CPC .................. H05K 2203/13; H05K 2203/1305; H05K 2203/1316; H05K 2203/1327
USPC .............................. 361/748; 29/832; 174/521
See application file for complete search history.

(56) References Cited

U.S. PATENT DOCUMENTS 5,192,682 A * 3/1993 Kodai et al. ...................... 29/841
5,617,297 A * 4/1997 Lo et al. ......................... 361/737

(Continued)

FOREIGN PATENT DOCUMENTS

DE    19650255 A1 * 6/1998
JP    H10209338 A    8/1998

(Continued)

*Primary Examiner* — Jeremy C Norris
*Assistant Examiner* — Nathan Milakovich
(74) *Attorney, Agent, or Firm* — Foley & Lardner LLP; Cliff Z. Liu; Angela D. Murch

(57) ABSTRACT

An electronic package module includes a circuit board having a supporting surface, at least one first electronic component, at least one second electronic component, and at least one molding compound. The first and second electronic components are mounted on the supporting surface. The molding compound is disposed on the supporting surface and covers the supporting surface partially. The molding compound encapsulates the first electronic component yet not the second electronic component.

19 Claims, 7 Drawing Sheets

(56) References Cited

U.S. PATENT DOCUMENTS

| | | | | |
|---|---|---|---|---|
| 5,885,854 | A * | 3/1999 | Wensel | H01L 21/312 257/E21.259 |
| 6,709,170 | B2 * | 3/2004 | Tartaglia | B29C 70/72 385/88 |
| 7,748,111 | B2 * | 7/2010 | Wang et al. | 29/830 |
| 8,134,292 | B2 * | 3/2012 | Yan | H01L 33/501 313/506 |
| 8,217,507 | B1 * | 7/2012 | Galloway et al. | 257/690 |
| 8,631,566 | B2 * | 1/2014 | Palm et al. | 29/841 |
| 2004/0232560 | A1 * | 11/2004 | Su | H01L 21/563 257/778 |
| 2010/0132190 | A1 * | 6/2010 | Grosso et al. | 29/841 |
| 2012/0017436 | A1 * | 1/2012 | Wing et al. | 29/841 |
| 2012/0120613 | A1 * | 5/2012 | Kuwabara et al. | 361/746 |
| 2012/0188727 | A1 | 7/2012 | Lin et al. | |
| 2013/0176746 | A1 * | 7/2013 | Nishimura et al. | 362/382 |
| 2014/0024217 | A1 | 1/2014 | Ohtsu et al. | |
| 2014/0084483 | A1 * | 3/2014 | Chen et al. | 257/774 |
| 2014/0098505 | A1 * | 4/2014 | Baker | 361/764 |
| 2014/0190930 | A1 * | 7/2014 | Mayo et al. | 216/13 |
| 2014/0240911 | A1 * | 8/2014 | Cole | G06F 1/1626 361/679.3 |
| 2014/0290054 | A1 * | 10/2014 | Etzkorn | 29/832 |
| 2015/0035201 | A1 * | 2/2015 | Chen et al. | 264/264 |
| 2015/0036297 | A1 * | 2/2015 | Chen et al. | 361/748 |

FOREIGN PATENT DOCUMENTS

| | | | |
|---|---|---|---|
| JP | H1197657 A | | 4/1999 |
| JP | 2007059846 A | * | 3/2007 |
| JP | 2007294828 A | | 11/2007 |
| JP | 2008140870 A | | 6/2008 |
| JP | 2008288610 A | | 11/2008 |
| JP | 2010098077 A | | 4/2010 |
| JP | 2013179152 A | | 9/2013 |
| TW | 525630 U | | 3/2003 |
| TW | 200944086 A1 | | 10/2009 |
| TW | 201241581 A1 | | 10/2012 |

* cited by examiner

ELECTRONIC PACKAGE MODULE AND METHOD OF MANUFACTURING THE SAME

BACKGROUND

1. Field of the Invention

The instant disclosure relates to an electronic component and method of manufacturing the same; in particular, to an electronic package module and method of manufacturing the same.

2. Description of Related Art

Typically, a conventional electronic package module includes a circuit board and a plurality of electronic components disposed thereon. The electronic components may be, for example, chip packages, passive components or the like. In addition, the majority of the electronic package modules further include molding compounds to encapsulate the electronic components and provide protection of the electronic components.

However, certain electronic components, especially photoelectric components such as CMOS Image Sensors (CISs), Charge-Coupled Devices (CCDs), Light Emitting Diodes (LEDs), or the like are not suitable to be encapsulated by molding compounds. It is common that the electronic package module which contains a photoelectric component and a non-photoelectric component does not have molding compound to ensure that the photoelectric components can be in normal operation.

SUMMARY OF THE INVENTION

The instant disclosure is to provide an electronic package module which includes a plurality of electronic components and a molding compound. The molding compound only encapsulates at least one of the electronic components and does not encapsulate all of the electronic components.

The instant disclosure also provides a method of manufacturing the aforementioned electronic package module.

According to one exemplary embodiment of the instant disclosure, an electronic package module includes a circuit board, at least one first electronic component, at least one second electronic component and at least one molding compound. The circuit board has a supporting surface. The first and second electronic components are mounted on the supporting surface. The molding compound is arranged on the supporting surface and partially covers the supporting surface. The molding compound encapsulates at least one first electronic component but does not encapsulate the second electronic component.

According to another exemplary embodiment of the instant disclosure, a method of manufacturing the electronic package module is provided. Firstly, a circuit board assembly is provided. The circuit board assembly includes a circuit board having a supporting surface, at least one first electronic component and at least one second electronic component. Then a mask pattern layer is formed on the circuit board assembly. The first and second electronic components are mounted on the supporting surface. The mask pattern layer with at least one hollow region partially covers the supporting surface. The first electronic component is positioned to the hollow region. In addition, the mask pattern layer completely covers the second electronic component. Subsequently, a molding compound is formed in the hollow region and encapsulates the first electronic component. After the formation of molding compound, the mask pattern layer is removed, and thus the second electronic component is exposed.

Therefore, the electronic package module includes the molding compound encapsulating at least one of the electronic components. Thus, the conventional electronic package module containing a photoelectric component (for example, an image sensor or a light emitting unit) can utilize the instant disclosure to allow partial coverage for electronic components. In other words, the molding compound can encapsulate the requisite electronic component and not encapsulate the electronic component such as the photoelectric component, which is not suitable to be encapsulated. Hence, the molding compound does not affect the normal operation of the photoelectric component and meanwhile protects the other electronic components. Note that the instant disclosure is not limited to protection of electronic components (regardless being encapsulated or not) and other active or passive components can also be applied.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1A:
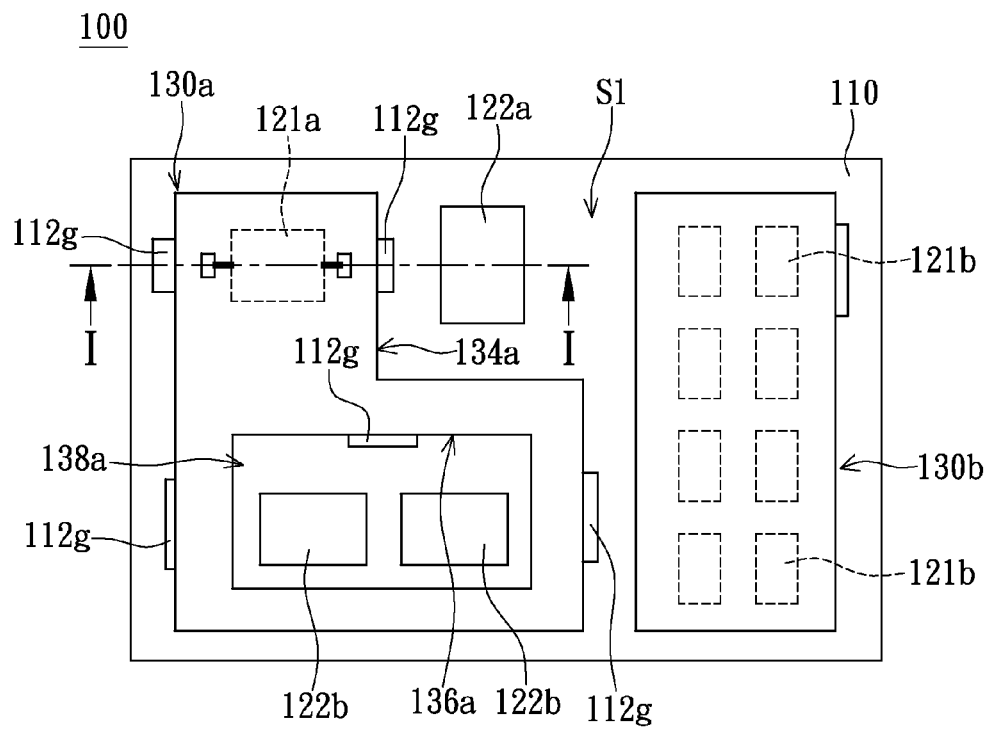
FIG. 1A is a top schematic view of an electronic package module in accordance with an embodiment of the instant disclosure.
Figure 1B:
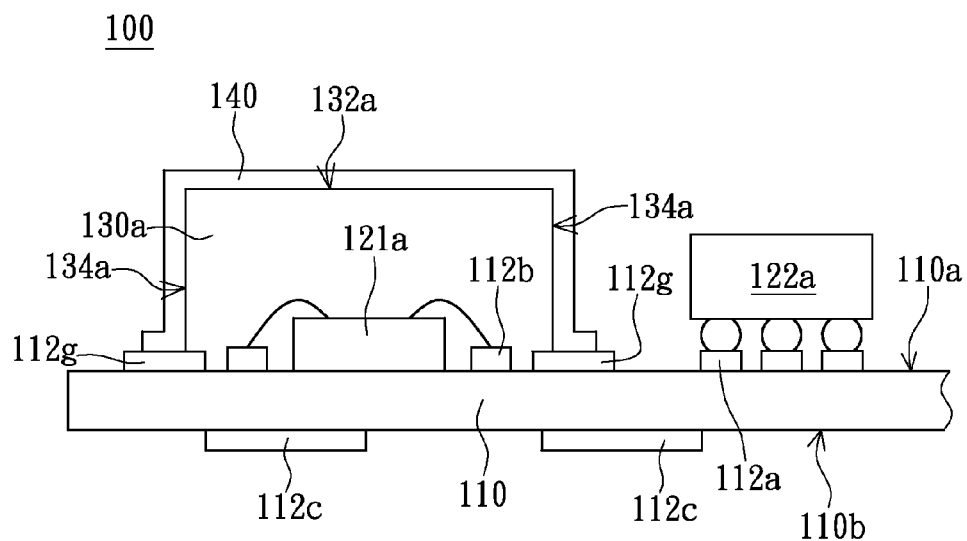
FIG. 1B is a cross-sectional schematic view along line I-I in FIG. 1A.

FIG. 1A is a top schematic view of an electronic package module in accordance with an embodiment of the instant disclosure. FIG. 1B is a cross-sectional schematic view along line I-I in FIG. 1A. Attention now is invited to FIGS. 1A and 1B. The electronic package module 100 includes a circuit board 110, at least one first electronic component, at least one second electronic component and at least one molding compound. Take FIG. 1A for example. The electronic package module 100 includes a plurality of first electronic components, a plurality of second electronic components and a plurality of molding compounds. The first electronic components are designated as 121a and 121b, while the second electronic components are designated as 122a and 122b. The molding compounds are designated as 130a and 130b.

However, in other embodiments, the quantity of the first electronic component can be one. The second electronic component can be one, and the molding compound can be one as well. That is to say, the quantity of the first electronic component, the second electronic component, or the molding compound can be one, two, or more than two. The quantities of the first electronic component, the second electronic component, and the molding compound are not limited to FIG. 1A.

The circuit board 110 includes a supporting surface 110a. The first electronic components 121a, 121b, and the second electronic components 122a, 122b are mounted on the supporting surface 110a and electrically connect to the circuit board 110 to permit electrical signal transmission among the first electronic components 121a, 121b, and the second electronic components 122a, 122b. Thus, the first electronic components 121a, 121b, and the second electronic components 122a, 122b can work.

The circuit board 110 includes a plurality of pads 112a, 112b. The second electronic component 122a can electrically connect to the pad 112a by flip-chip, and the first electronic component 121a can electrically connect to the pad 112b by wire bonding as shown in FIG. 1B. Likewise, the second electronic component 122a can electrically connect to the pads 112a by wire bonding, whereas the first electronic component 121 can electrically connect to the pads 112b by flip-chip. That is to say, the connection arrangement between the first, second electronic components 121a, 122a and the circuit board 110 is not limited to FIG. 1B.

The circuit board 110 can be a double side circuit board with two layers of circuits or a multilayer circuit board with more than two layers of circuits. The circuit board 110 further includes a circuit board bottom surface 110b opposite to the supporting surface 110a and a plurality of pads 112c on the circuit board bottom surface 110b. The pads 112c can be electrically connect to another circuit board, such as printed circuit board. The pads 112c can electrically connect to pads 112a and 112b by the conductive blind vias, conductive through holes or conductive buried holes.

The molding compounds 130a and 130b are mounted on the supporting surface 110a. Each of the molding compounds 130a and 130b partially covers the supporting surface 110a and encapsulates at least one first electronic component. For example, the molding compound 130a encapsulates one first electronic component 121a, and the molding compound 130b encapsulates eight first electronic components 121b. Nevertheless, the molding compounds 130a and 130b do not encapsulate and do not contact any of the second electronic components 122a and 122b.

Moreover, the second electronic components 122a and 122b which are not encapsulated by the molding compounds 130a and 130b may be photoelectric components such as image sensors or light emitting units. The image sensor can be such as a CMOS Image Sensor or a Charge-Coupled Device (CCD). The light emitting unit may be such as a Light Emitting Diode (LED). However, the second electronic components 122a, 122b are not limited to the aforementioned photoelectric components. The second electronic components 122a and 122b may be active or passive components.

Take FIGS. 1A and 1B for example. The molding compound 130a has an opening 138a. Two second electronic components 122b are arranged inside the opening 138a. In other words, the molding compound 130a surrounds the second electronic components 122b and is not in contact with the second electronic components 122b. Furthermore, the embodiment in FIG. 1A shows two second electronic components 122b arranged inside the opening 138a. However, the quantity of the second electronic components 122b inside the opening 138a can be one or at least three in other embodiment. Therefore, the quantity of the second electronic components 122b at the opening 138a is not limited by FIG. 1A. In addition, a person skilled in the art should understand that when the molding compound 130a does not have opening 138a, the second electronic components 122b are absent in the molding compound 130a.

The second electronic components 122a can be disposed between the molding compounds 130a and 130b. Specifically, a region S1 is defined by the molding compounds 130a, 130b and the supporting surface 110a. The second electronic component 122a is mounted on the supporting surface 110a of the region S1. Thus, the molding compound 130a and 130b do not encapsulate the second electronic components 122a and are not in contact with the second electronic components 122a.

It is worth mentioned that in the embodiment shown in FIG. 1A, only one second electronic component 122a is disposed in the region S1. However, the quantity of the second electronic component 122a disposed in the region S1 can be two or more than two so that the quantity of the second electronic component 122a is not restricted to that shown in FIG. 1A.

The electronic package module 100 may further include at least one shielding conductive layer 140. In the instant embodiment, the electronic package module 100 includes two shield conductive layers 140. One of the shielding conductive layers 140 covers the molding compound 130a while the other one covers the molding compound 130b. Furthermore, the shield conductive layers 140 completely cover the molding compounds 130a and 130b.

Take FIGS. 1A and 1B for example. The molding compound 130a has a top surface 132a and sides 134a, 136a both connected to the top surface 132a. The sides 134a and 136a are positioned between the top surface 132a and the supporting surface 110a. The side 136a is the sidewall of the opening 138a whereas the side 134a is the outer surface of the molding compound 130a as shown in FIGS. 1A and 1B.

The shielding conductive layer 140 completely covers the top surface 132a and the sides 134a, 136a. Hence, the shielding conductive layer 140 fully covers the molding compound 130a. Similarly, the other shielding conductive layer 140 completely covers the top surface and the sides of the molding compound 130b. Therefore, the shielding conductive layers 140 entirely blanket the molding compounds 130a and 130b. In addition, the shielding conductive layers 140 may be in contact with the top surface 132a, the sides 134a, 136a and both the top and the sides of the molding compound 130b.

The shielding conductive layers 140 may be a conductive film formed by deposition so the shielding conductive layers 140 cover the molding compounds 130a and 130b conformably. The means of the deposition may be spraying, electroplating, electroless plating, Physical Vapor Deposition (PVD) or Chemical Vapor Deposition (CVD). The PVD may be evaporation or sputtering.

The molding compounds 130a and 130b are fully covered by the shielding conductive layers 140 so the shielding conductive layers 140 can envelop the first electronic components 121a and 121b within the molding compounds 130a and 130b. Thus, the shielding conductive layers 140 can block Electro-Magnetic Interference (EMI), thereby attenuating the influence on the first electronic components 121a and 121b from EMI.

In addition, the circuit board 110 may have a plurality of grounding pads 112g mounted on the supporting surface 110a. The shielding conductive layers 140 connect to the grounding pads 112g which are grounded. For example, the grounding pads 112g electrically connect to the ground plane (not shown) of the circuit board 110. The shielding conductive layers 140 are grounded via the grounding pads 112g.

Thus, the function of the shielding conductive layers 140 for blocking EMI can be enhanced.

It is worth mentioned that although the circuit board 110 includes a plurality of grounding pads 112g as shown in FIGS. 1A and 1B, the quantity of the grounding pads 112g is not limited thereto. A single grounding pad 112g is also acceptable.

The molding compounds 130a and 130b only encapsulate the first electronic components 121a and 121b except the second electronic components 122a and 122b. The conventional electronic package module containing a photoelectric component, such as an image sensor or a light emitting unit, and the other electronic components may adapt the design of the electronic package module 100 to selectively encapsulate certain components. The molding compounds do not affect the operation of the photoelectric component, and the other electronic components are still under protection. It is noted that the electronic package module 100 may include only one molding compound 130a or 130b or more than two molding compounds and is not limited to the instant embodiment.

The preceding description is mainly mentioned the structure of the electronic package module 100. The method of manufacturing the electronic package module 100 is described herein with reference to FIGS. 2A to 2G.

Figure 2A:
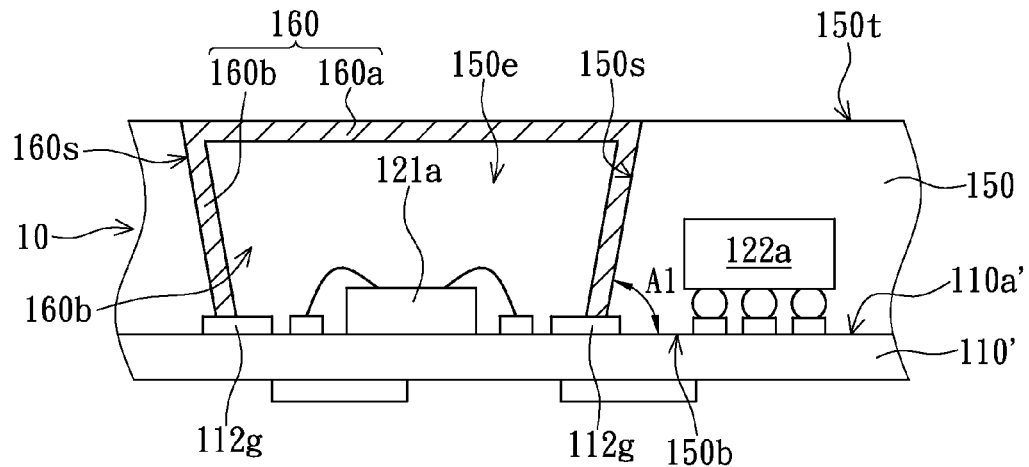
FIGS. 2A to 2H are cross-sectional schematic views of FIG. 1B showing a method of manufacturing the electronic package module.

Attention now is invited to FIG. 2A. In the method of manufacturing the electronic package module 100, firstly, a mask pattern layer 150 is formed on the circuit board assembly 10. The circuit board assembly 10 refers to a circuit board with a plurality of electronic components mounted thereon. Specifically, the circuit board assembly 10 includes a circuit board 110', at least one first electronic component and at least one second electronic component. The first and second electronic components are mounted on a supporting surface 110a' of the circuit board 110'. That is to say, before the mask pattern layer 150 is formed, the first and second electronic components are mounted on the circuit board 110' already.

Although only one first electronic component 121a and one second electronic component 122a are mounted on the supporting surface 110a' shown in FIG. 2A, the first electronic component 121b and the second electronic component 122b are also mounted on the supporting surface 110a'. A person skilled in the art should understand that the first electronic components 121a, 121b and the second electronic components 122a, 122b are all mounted on the supporting surface 110a' as the layout shown in FIG. 1A, according to common knowledge in the field.

In the instant embodiment, the circuit board 110' is in similar structure as the circuit board 110 shown in FIG. 1B, and the circuit board 110' includes a plurality of grounding pads 112g. However, the difference between the circuit boards 110' and 110 arises from the dimension. The dimension of the circuit board 110' is larger than that of the circuit board 110.

Specifically, the circuit board 110 may be the circuit board unit obtained by dicing (i.e. singulating) the circuit board 110'. The circuit board 110' may be a circuit panel or a strip. In other embodiments, the circuit board 110' may be identical to the circuit board 110. That is to say, the circuit board 110' can be an already diced circuit board unit.

After the formation of mask pattern layer 150, the mask pattern layer 150 partially covers the supporting surface 110a'. The mask pattern layer 150 does not cover the hollow region of the first electronic components 121a and 121b whereas the second electronic components 122a and 122b are fully covered thereby. Take FIG. 2A for example. The first electronic component 121a is within the hollow region 150e so the mask pattern layer 150 does not coat or contact the first electronic component 121a. In contrast, the mask pattern layer 150 completely covers the second electronic component 122a.

Moreover, the quantity of the hollow region (such as hollow region 150e) is the same as the total quantity of the molding compounds 130a and 130b. The mask pattern layer 150 may have one or more hollow regions.

In the embodiment shown in FIG. 2A, the mask pattern layer 150 has an upper surface 150t and a corresponding lower surface 150b. The lower surface 150b is in contact with the circuit board assembly 10 and gradually shrinks toward the upper surface 150t. Thus the area of the upper surface 150t is smaller than that of the lower surface 150b which results in a slanting side 150s connecting the top and lower surfaces 150t, 150b. The slanting side 150s and the lower surface 150b together form an included angle A1 smaller than 90° as shown in FIG. 2A.

Figure 2B:
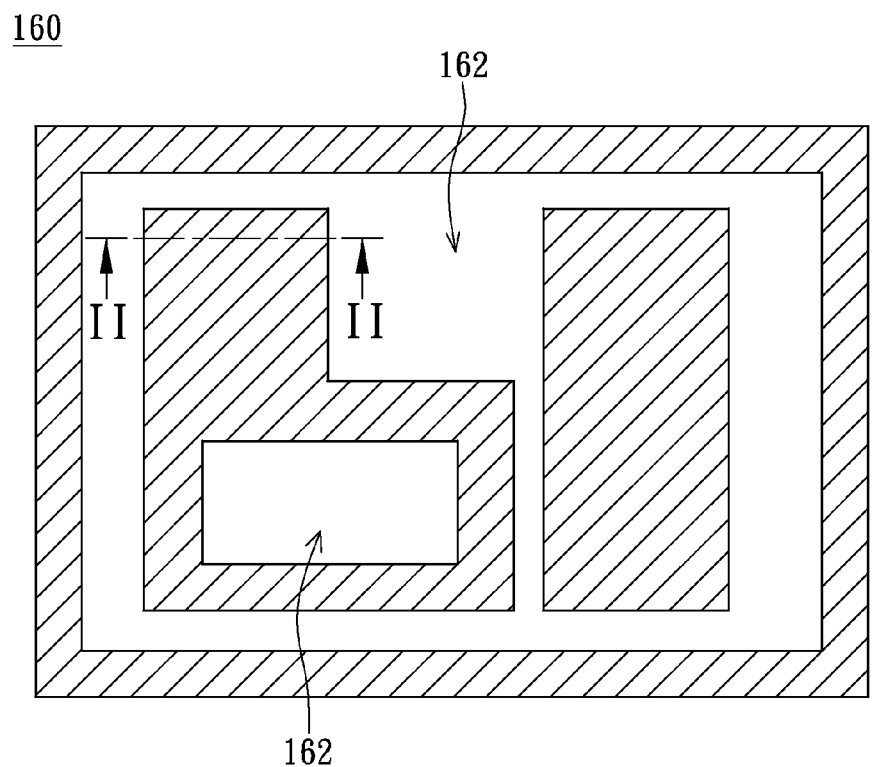
Figure 2C:
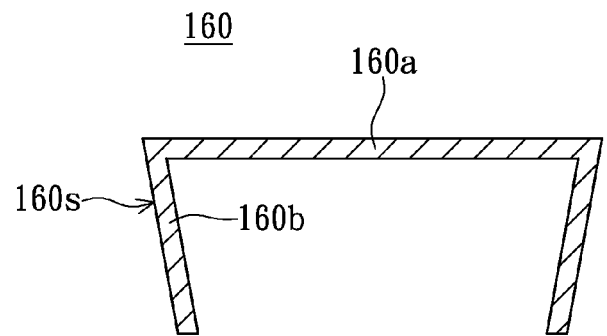

The mask pattern layer 150 may be formed by different means. In the instant embodiment, the mask pattern layer 150 is formed by mold printing. Specifically, please refer to FIGS. 2A to 2C. Firstly, a template 160 is atop the circuit board assembly 10 acting as a cover. A paint layer is printed onto the circuit board 110'. The paint layer may be conventional print or positive, negative photoresist materials. FIG. 2B shows a top schematic view of the template 160. FIG. 2C shows a schematically cross-sectional view along the line II-II in FIG. 2B. The template 160 shown in FIG. 2A is a cross-sectional view along the line II-II in FIG. 2B. The template 160 has a plurality of hollow regions 162 corresponding to the second electronic components 122a and 122b (please refer to FIG. 1A). In the aforementioned printing process, the paint layer passes through the hollow regions 162 and blankets the second electronic components 122a and 122b except the first electronic components 121a and 121b.

Subsequently, the paint layer is cured. The paint layer is cured to become the mask pattern layer 150 by heating or ultraviolet treatment. During the cure, the template 160 may remain on the circuit board assembly 10 to cover the circuit board 10. After the paint layer is cured, the template 160 is removed, and the hollow region 150e is formed. In addition, in the instant embodiment, the mask pattern layer 150 may contain silicon oxide such as silicon dioxide in the composition.

It is worth mentioned that template 160 may have at least one plate 160a and at least one wall 160b. The plate 160a connects to the wall 160b and has template slanting sides 160s. In the formation of the mask pattern layer 150, the template slanting sides 160s are in contact with the paint layer and form the slanting sides 150s of the mask pattern layer 150 as shown in FIGS. 2A and 2C.

Note that in the instant embodiment, the mask pattern layer 150 is formed by template 160 printing. In other embodiments, the mask pattern layer 150 may be formed without the template 160. Specifically, the mask pattern layer 150 may use template 160 as cover and be formed by spraying. The mask pattern layer 150 may be formed by different ways and is not limited to the instant embodiment.

Figure 2D:
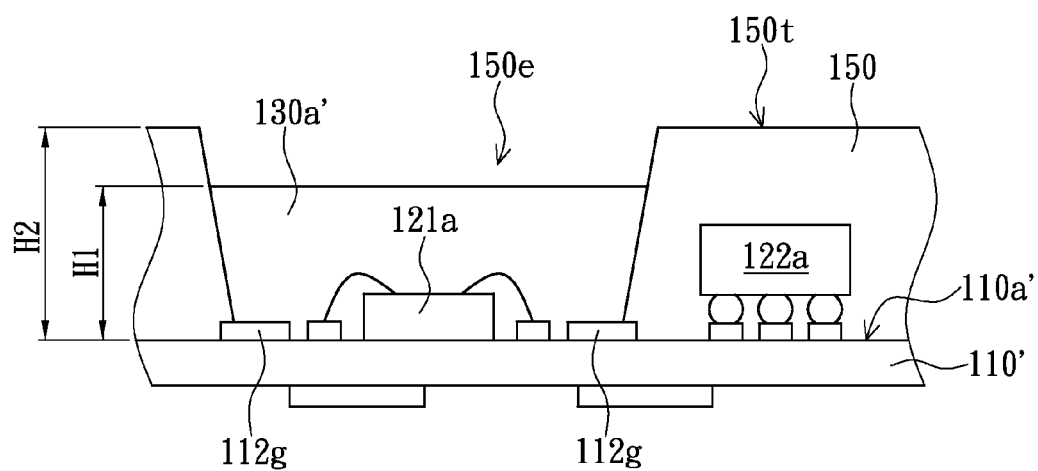

Attention is now invited to FIG. 2D. A mold compound is formed within the hollow region 150e to encapsulate the first electronic components so all the first electronic components 121a and 121b of the electronic package module 100 are encapsulated by the mold compound (as the mold compound 130a' shown in FIG. 2D). The mold compound may be formed by dispenser and the primary material thereof can be epoxy. The epoxy may contain silicon oxide, aluminium oxide or the like. Furthermore, the mold compound is only formed on the hollow region and not expanding beyond.

Therefore, in general the mold compound does not cover the upper surface 150t of the mask pattern layer 150.

Take FIG. 2D for example. The mold compound 130a' is formed inside the hollow region 150e, encapsulates at least one first electronic component 121a and covers at least one grounding pad 112g as well as part of the supporting surface 110a'; however, the upper surface 150t of the mask pattern layer is not covered. The thickness H1 of the mold compound 130a' corresponding to the supporting surface 110a' is thinner than the thickness H2 of the mask pattern layer 150 corresponding to the supporting surface 110a' so as to prevent the mold compound 130a' from exceeding and covering the upper surface 150t.

Figure 2E:
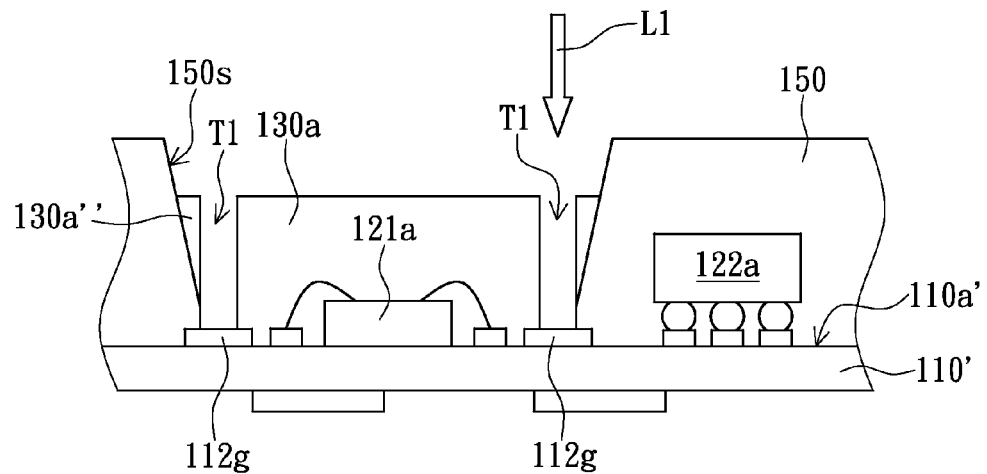

Attention now is invited to FIGS. 2D and 2E. After the formation of the mold compound, the mold compound is cut to form a plurality of trenches exposing the grounding pads 112g and part of the supporting surface 110a' (for example, the trench T1 shown in FIG. 2E). Additionally, laser cutter can also be utilized in the cutting process. The laser beam L1 which conducts the cutting process can be green laser. Nevertheless, the cutting process may be conducted by different ways such as machine slicing.

The trenches follow about the outline of the mold compounds 130a and 130b as shown in FIG. 1A. For example, one of the trenches substantially resembles the opening 138a outline of the mold compound 130a. In FIG. 2E, after the cutting of the mold compound 130a', the trench T1 is formed and resembles the side 134a outline of the mold compound 130a as shown in FIG. 1A.

After the cutting of the mold compound, in addition to the trenches, the mold compounds 130a and 130b are formed as shown in FIG. 1A. Part of the mold compound 130a' remains on the mask pattern layer 150 being mold compound residues 130a". In general, the mold compound residues 130a" attach to the slanting sides 150s of the mask pattern layer 150 yet not the grounding pad 112g.

Figure 2F:
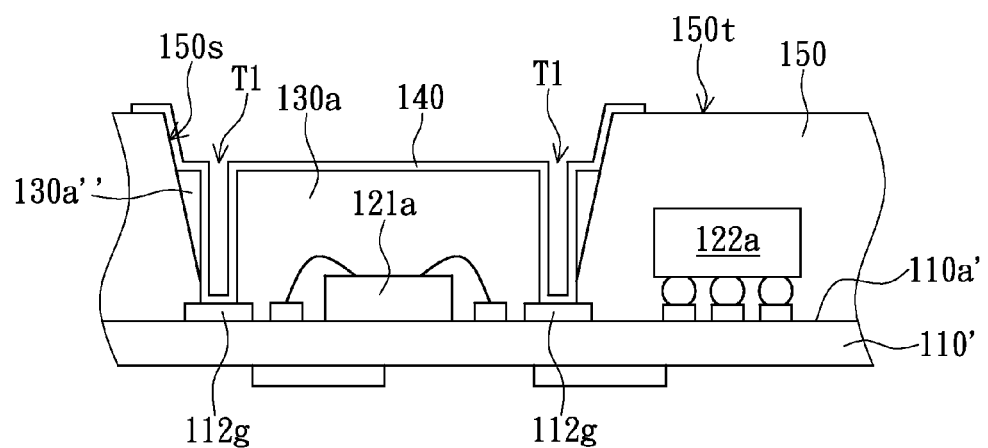

Attention is now invited to FIG. 2F. The shielding conductive layer 140 is formed after the cutting. The shielding conductive layer 140 extends toward all the trenches (including the trench T1) and connects to the grounding pads 112g. The shielding conductive layer 140 may be formed by deposition such as spraying, electroplating, electroless plating, PVD, or CVD. The PVD may be evaporation or sputtering.

The shielding conductive layer 140 may further cover the mold compound residues 130a" along with mask pattern layer 150 and touch mask pattern layer 150. The shielding conductive layer 140 covers part of the mask pattern layer 150 and exposes the remaining. Take FIG. 2F for example. The shielding conductive layer 140 stretches from the mold compound 130a" along the slanting side 150s to the upper surface 150t. In this way, the shielding conductive layer 140 covers the region of slanting side 150s where the mold compound residues 130a" are not attached, and the upper surface 150t nearby. Hence, the shielding conductive layer 140 contacts the upper surface 150t and slanting side 150s of the mask pattern layer 150 and the remaining upper surface 150t is exposed.

Figure 2G:
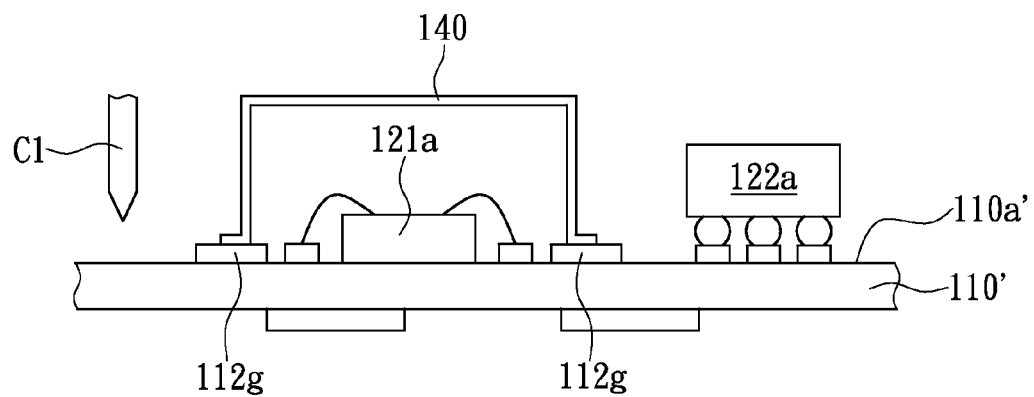

Attention now is invited to FIGS. 2F and 2G After the formation of shielding conductive layer 140, the mask pattern layer 150 is removed to expose the second electronic components 122a and 122b (not shown in FIG. 2G) and part of the supporting surface 110a'. The mask pattern layer 150 may be removed by dissolving in solvent. The solvent may be acetone or bromopropane. Although the shielding conductive layer 140 covers the mask pattern layer 150, the upper surface 150t of the mask pattern layer 150 is partially exposed. Therefore the solvent is in contact with the mask pattern layer 150 and dissolves the mask pattern layer 150. In addition, the mold compound residues 130a" are not attached to the grounding pads 112g so as the mask pattern layer 150 is removed, the mold compound residues 130a" are swept as well.

Figure 2H:
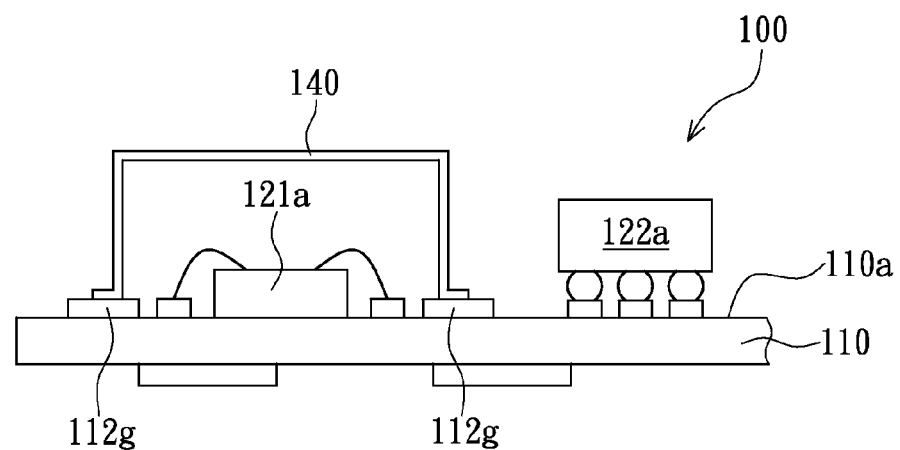

Attention is now invited to FIGS. 2G and 2H. Subsequently, a cutter C1 is used to dice the circuit board 110' to form the electronic package module 100. To this step, the electronic package module 100 is completed as shown in FIG. 2H. In the instant embodiment, the cutter C1 is used to dice the circuit board 110' and the dicing method is not limited thereto. For example, laser beam can be used to dice the circuit board 110'.

Furthermore, the circuit board 110' may be equivalent to the circuit board 110. That is to say, the circuit board 110' shown in FIG. 2A may be diced circuit board unit so after the removal of the mask pattern layer 150, the electronic package module 100 is completed without proceeding with dicing.

Figure 3A:
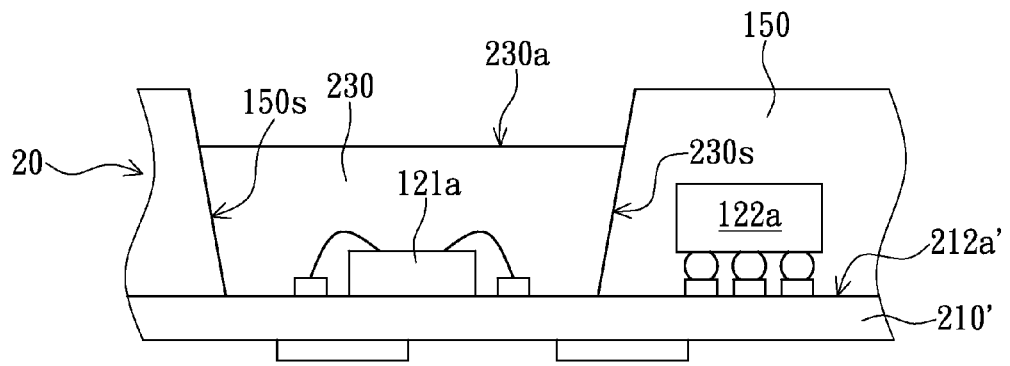
FIGS. 3A to 3C are cross-sectional schematic views showing a method of manufacturing an electronic package module in accordance with another embodiment of the instant disclosure.
Figure 3B:
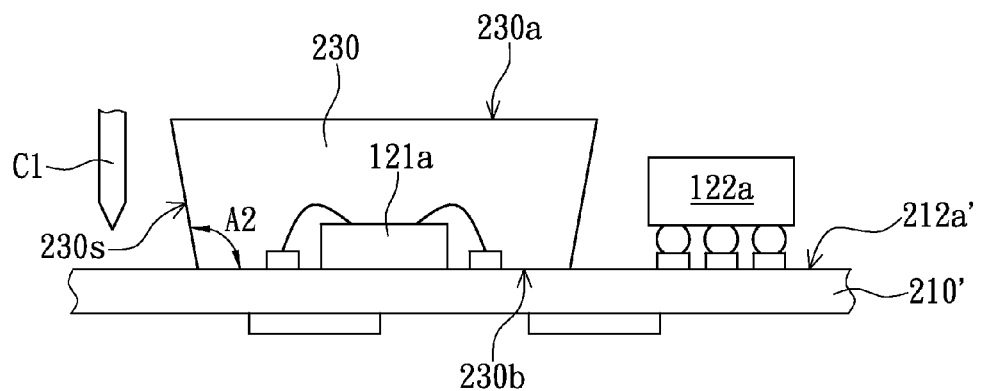
Figure 3C:
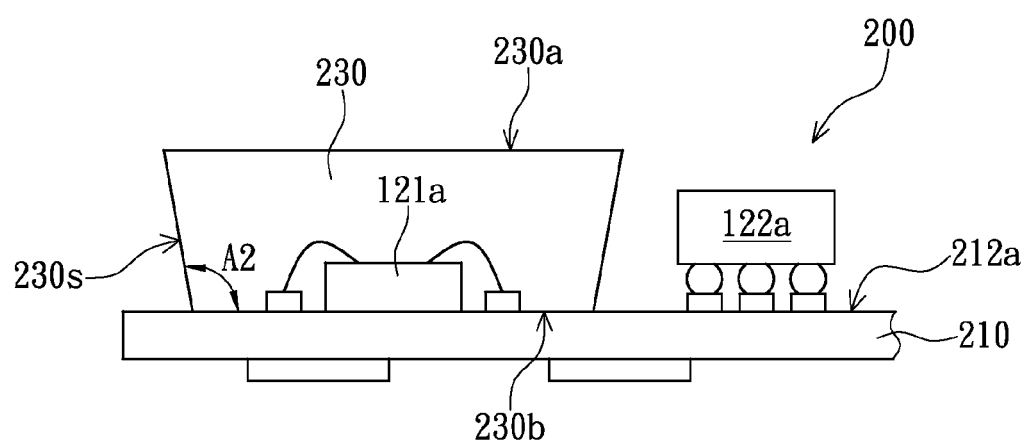

FIGS. 3A to 3C show cross-sectional view of the method of manufacturing the electronic package module in accordance of another embodiment. Attention now is invited to FIG. 3C. The electronic package module 200 is similar to the electronic package module 100. For example, the electronic package module 200 includes at least one first electronic component 121a and at least one second electronic component 122a. The difference between the electronic package modules 100 and 200 are described herein.

As shown in FIG. 3C, the electronic package module 200 includes at least one molding compound 230 and one circuit board 210. The first electronic components 121a and the second electronic components 122a are mounted on the supporting surface 212a of the circuit board 210. The difference between the electronic package modules 100 and 200 arises from that the electronic package module 200 may not include grounding pads 112g. The cross-section of the molding compound 230 is different from that of the molding compounds 130a and 130b. In addition, the electronic package module 200 does not include shielding conductive layer 140. It is worth mentioned that in the instant embodiment, the circuit board may have grounding pads 112g, and the grounding pad addition thereon is not limited thereto.

The molding compound 230 has a top surface 230a, a molding compound bottom surface 230b opposite thereto and a side 230s connecting between the top surface 230a and the molding compound bottom surface 230b. The molding compound bottom surface 230b is in contact with the supporting surface 212a so the side 230s is arranged between the top surface 230a and the supporting surface 212a. The molding compound 230 gradually shrinks from the top surface 230a to the supporting surface 212a. Therefore the area of the top surface 230a is larger than that of the molding compound bottom surface 230b, and the side 230s is slanting. The included angle A2 between the side 230s and the supporting surface 212a is larger than 90°.

The method of manufacturing the electronic package module 200 is similar to the previous embodiment (i.e. electronic package module 100). The difference between the method of manufacturing the electronic package modules 100 and 200 is discussed herein with the reference to FIGS. 3A to 3C. The identical features are not repeated herein.

Attention now is invited to FIG. 3A. In the method of manufacturing the electronic package module 200, firstly, the mask pattern layer 150 is formed on a circuit board assembly 20. The circuit board assembly 20 includes a circuit board 210', at least one first electronic component 121a and at least one second electronic component 122a.

The first electronic components 121a and the second electronic components 122a are mounted on the supporting surface 212a' of the circuit board 210'. The mask pattern layer 150 covers the second electronic component 122a yet not the first electronic component 121a. In addition, the mask pattern layer 150 is formed by the same way as described previously so the slanting side 150s is also present in FIG. 3A.

Subsequently, the molding compound 230 which encapsulates the first electronic component 121a is formed. The molding compound 230 is formed by the same way as the molding compounds 130a and 130b. The mask pattern layer 150 has slanting side 150s, and the molding compound 230 is in contact with the slanting side 150s so to form the slanting side 230s of the molding compound 230.

Then, after the formation of the molding compound 230, the step of dicing the molding compound 230 is omitted while the mask pattern layer 150 is removed straightaway to expose the second electronic component 122a. The removal of the mask pattern layer 150 is described previously.

Attention now is invited to FIGS. 3B and 3C. The cutter C1 or laser beam is used to dice the circuit board 210' to form the circuit board 210. The electronic package module 200 is then completed as shown in FIG. 3C. Additionally, the circuit board 210' may be equivalent to the circuit board 210. That is to say, the circuit board 210' may be an already diced circuit board unit. Thus after the removal of the mask pattern layer 150, the electronic package module 200 is completed without dicing the circuit board 210'. In other words, the dicing step shown in FIG. 3B may be ignored.

In summary, the instant disclosure provides an electronic package module including the molding compound which encapsulates at least one electronic component thereon. The conventional electronic package module containing photoelectric components (such as image sensor or light emitting unit), and the others may adapt the layout of the instant disclosure to allow partial encapsulation and exposure to the photoelectric components. Hence, the molding compound does not affect the photoelectric component operation and protects the other components. The instant disclosure may cooperate with different electronic components (for example, active or passive components) and not limited to the aforementioned electronic components.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. An electronic package module comprising:
a circuit board having a supporting surface;
at least one first electronic component disposed on the supporting surface;
at least one second electronic component disposed on the supporting surface; and
at least one molding compound arranged on the supporting surface and partially covering thereon, the molding compound solely encapsulating the at least one first electronic component;
wherein the at least one molding compound includes an opening, and the at least one second electronic component is disposed at the opening; and
wherein the at least one molding compound includes a top surface and a side connecting the top surface, the side is positioned between the top surface and the supporting surface, and the at least one molding compound gradually shrinks from the top surface to the supporting surface.

2. The electronic package module according to claim 1 further comprising at least one shielding conductive layer covering the molding compound, and the circuit board further includes at least one grounding pad on the supporting surface connecting to the at least one shielding conductive layer.

3. The electronic package module according to claim 2, wherein the at least one molding compound includes a top surface and a side connecting to the top surface, the side is positioned between the top surface and the supporting surface, and the at least one shielding conductive layer covers the top surface and the side.

4. The electronic package module according to claim 1, wherein the side of the molding compound slants from the top surface to the supporting surface, and an included angle between the side of the molding compound and the supporting surface is larger than 90 degrees.

5. The electronic package module according to claim 1, wherein the at least one second electronic component is a photoelectric component.

6. The electronic package module of claim 1, further comprising a plurality of pads on the supporting surface, wherein the at least one first electronic component electrically connects to at least one of the plurality of pads by wire bonding, and the at least one second electronic component electrically connects to at least one other of the plurality of pads by flip chip bonding.

7. The electronic package module of claim 6, wherein the circuit board has a bottom surface opposite to the supporting surface, further comprising at least one pad disposed on the bottom surface.

8. The electronic package module of claim 7, wherein the at least one pad on the bottom surface electrically connects to at least one of the pads on the supporting surface by at least one selected from the group consisting of: a conductive blind via, a conductive through hole and a conductive buried hole.

9. The electronic package module of claim 1, wherein the at least one molding compound comprises an epoxy resin.

10. The electronic package module of claim 9, wherein the epoxy resin comprises silicon oxide or aluminum oxide.

11. The electronic package module of claim 1, wherein the circuit board is a diced circuit board unit.

12. The electronic package module of claim 1, wherein the at least one molding compound is formed in a hollow region of a mask pattern layer.

13. The electronic package module of claim 12, wherein the mask pattern layer is formed by printing a paint layer on the supporting surface and then curing the paint layer by heating or ultraviolet treatment.

14. The electronic package module of claim 13, wherein the paint layer is a positive or negative photoresist material.

15. The electronic package module of claim 1, wherein the circuit board includes at least two layers of circuits.

16. The electronic package module of claim 2, wherein the at least one shielding conductive layer is formed by at least one of the following: spraying, electroplating, electroless plating, physical vapor deposition (PVD) or chemical vapor deposition (CVD).

17. The electronic package module of claim 16, wherein the at least one shielding conductive layer is formed by PVD, and is performed by evaporation or sputtering.

18. The electronic package module of claim 2, wherein the at least one shielding conductive layer fully covers the at least one molding compound.

19. The electronic package module of claim 5, wherein the photoelectric component is at least one selected from the group consisting of: a CMOS Image Sensor, a Charge-Coupled Device (CCD), and a light emitting diode (LED).

* * * * *